US008793991B2

(12) United States Patent
Citver et al.

(10) Patent No.: US 8,793,991 B2
(45) Date of Patent: Aug. 5, 2014

(54) DISPLACER AND SUPERCONDUCTING MAGNET

(75) Inventors: Gregory Citver, Florence, SC (US); William Louis Einziger, Florence, SC (US); Yuri Lvovsky, Florence, SC (US)

(73) Assignee: General Electric Company, Schenectady, NY (US)

( * ) Notice: Subject to any disclaimer, the term of this patent is extended or adjusted under 35 U.S.C. 154(b) by 1060 days.

(21) Appl. No.: 12/630,532

(22) Filed: Dec. 3, 2009

(65) Prior Publication Data

US 2011/0136671 A1    Jun. 9, 2011

(51) Int. Cl.
*F02G 1/04* (2006.01)
*F01B 29/00* (2006.01)
*H01F 6/04* (2006.01)
*G01R 33/38* (2006.01)
*G01R 33/3815* (2006.01)

(52) U.S. Cl.
CPC .............. *H01F 6/04* (2013.01); *G01R 33/3804* (2013.01); *G01R 33/3815* (2013.01)
USPC .............................................. 60/508; 60/512

(58) Field of Classification Search
USPC ........... 60/508, 511, 513, 516–526, 495–507, 60/527–529; 92/34, 37, 39
See application file for complete search history.

(56) References Cited

U.S. PATENT DOCUMENTS

| 2,191,861 | A | * | 2/1940 | Rymal | 92/39 |
| 2,613,607 | A | * | 10/1952 | Sheen et al. | 417/388 |
| 2,715,687 | A | * | 8/1955 | Lawrence Makous | 310/87 |
| 2,847,035 | A | * | 8/1958 | Peters | 138/30 |
| 2,942,783 | A | * | 6/1960 | Dyer et al. | 236/1 R |
| 3,872,911 | A | * | 3/1975 | Janes | 160/1 |
| 4,026,110 | A | * | 5/1977 | Engstrom | 60/592 |
| 4,336,713 | A | * | 6/1982 | Meyer | 374/197 |
| 4,620,418 | A | * | 11/1986 | Fujiwara et al. | 60/517 |
| 4,769,992 | A | * | 9/1988 | Harada et al. | 60/520 |
| 5,430,333 | A | * | 7/1995 | Binford et al. | 290/54 |
| 5,782,095 | A | * | 7/1998 | Chen | 62/47.1 |
| 6,679,045 | B2 | * | 1/2004 | Karafillis et al. | 60/39.08 |
| 6,843,057 | B2 | * | 1/2005 | Yamamoto | 60/520 |
| 6,970,062 | B2 | * | 11/2005 | Mulder | 335/300 |
| 7,445,616 | B2 | * | 11/2008 | Petrakis | 604/890.1 |
| 7,655,001 | B2 | * | 2/2010 | Petrakis | 604/890.1 |

FOREIGN PATENT DOCUMENTS

CN    1606786 A    4/2005
CN    101221228 A    7/2008

* cited by examiner

*Primary Examiner* — Christopher Jetton
(74) *Attorney, Agent, or Firm* — Ziolkowski Patent Solutions Group, SC

(57) ABSTRACT

A displacer for adjusting a level of a liquid cryogen in a cryostat. The displacer including an expandable member at least partially defining a sealed chamber. The expandable member being configured to transition from a collapsed state where the sealed chamber has a smaller volume to an expanded state where the sealed chamber has a larger volume. The displacer includes a first end piece attached to a first end of the expandable member and a second end piece attached to a second end of the expandable member.

19 Claims, 5 Drawing Sheets

US 8,793,991 B2

DISPLACER AND SUPERCONDUCTING MAGNET

FIELD OF THE INVENTION

This disclosure relates generally to superconducting magnets and in particular to a displacer used to adjust a level of a liquid cryogen within a cryostat.

BACKGROUND OF THE INVENTION

Typically, superconducting magnets, such as those used in a magnetic resonance imaging system, are fully filled with liquid helium at the manufacturing facility. After being filled with the liquid helium, the superconducting magnet is ramped-up and tested to ensure that it performs according to its specifications. Then the magnet is shipped to an imaging site where it will be installed.

Liquid helium works well as a coolant for very low temperature applications, but it has a low boiling point. Once the magnet has been installed, a coldhead with a compressor is utilized to keep the loss of liquid helium due to evaporation to a minimum. The coldhead and compressor require a power supply in order to function. Typically, when a superconducting magnet is being shipped, a sufficient power supply is not available. Therefore, during a long shipment, the magnet may lose a significant percentage of the liquid helium used as a coolant. For example, one conventional design uses approximately 2000 liters of liquid helium and it is common to lose up to 1000 liters of liquid helium from the time the superconducting magnet leaves the factory until it is installed.

In order to avoid damaging the magnet, it is necessary to fully fill the superconducting magnet with liquid helium prior to ramping the superconducting magnet to its operational level at the installation site. Liquid helium is expensive and the process of adding liquid helium to compensate for losses incurred during shipping adds extra time and cost to the installation process for superconducting magnets. Therefore, there is a need for a more efficient and less expensive way to manage the liquid helium level in superconducting magnets.

BRIEF DESCRIPTION OF THE INVENTION

In an embodiment, a displacer for adjusting a level of a liquid cryogen in a cryostat includes an outer housing and an inner bellows disposed within the outer housing. The inner bellows is configured to change from a collapsed state to an expanded state. The displacer includes a first end piece attached to a first end of the inner bellows, the first end piece being configured to move with respect to the outer housing as the inner bellows changes from the collapsed state to the expanded state. The displacer includes a second end piece attached to a second end of the inner bellows and an outer bellows attached to the outer housing and at least one of the first end piece and the inner bellows.

In another embodiment, a displacer for adjusting a level of a liquid cryogen within a cryostat includes an expandable member at least partially defining a sealed chamber. The expandable member is configured to transition from a collapsed state where the sealed chamber has a smaller volume to an expanded state where the sealed chamber has a larger volume. The displacer includes a first end piece attached to a first end of the expandable member and a second end piece attached to a second end of the expandable member.

In another embodiment, a superconducting magnet includes a main coil disposed around a patient bore. The main coil is configured to generate a static magnetic field. The superconducting magnet includes a cryostat surrounding the main coil. The cryostat is configured to contain a liquid cryogen. The superconducting magnet also includes a displacer disposed within the cryostat. The displacer is configured to change from a collapsed state to an expanded state in order to adjust a level of the liquid cryogen.

Various other features, objects, and advantages will be made apparent to those skilled in the art from the accompanying drawings and detailed description thereof.

DETAILED DESCRIPTION OF THE INVENTION

In the following detailed description, reference is made to the accompanying drawings that form a part hereof, and in which is shown by way of illustration specific embodiments that may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken as limiting the scope of the invention.

Figure 1:
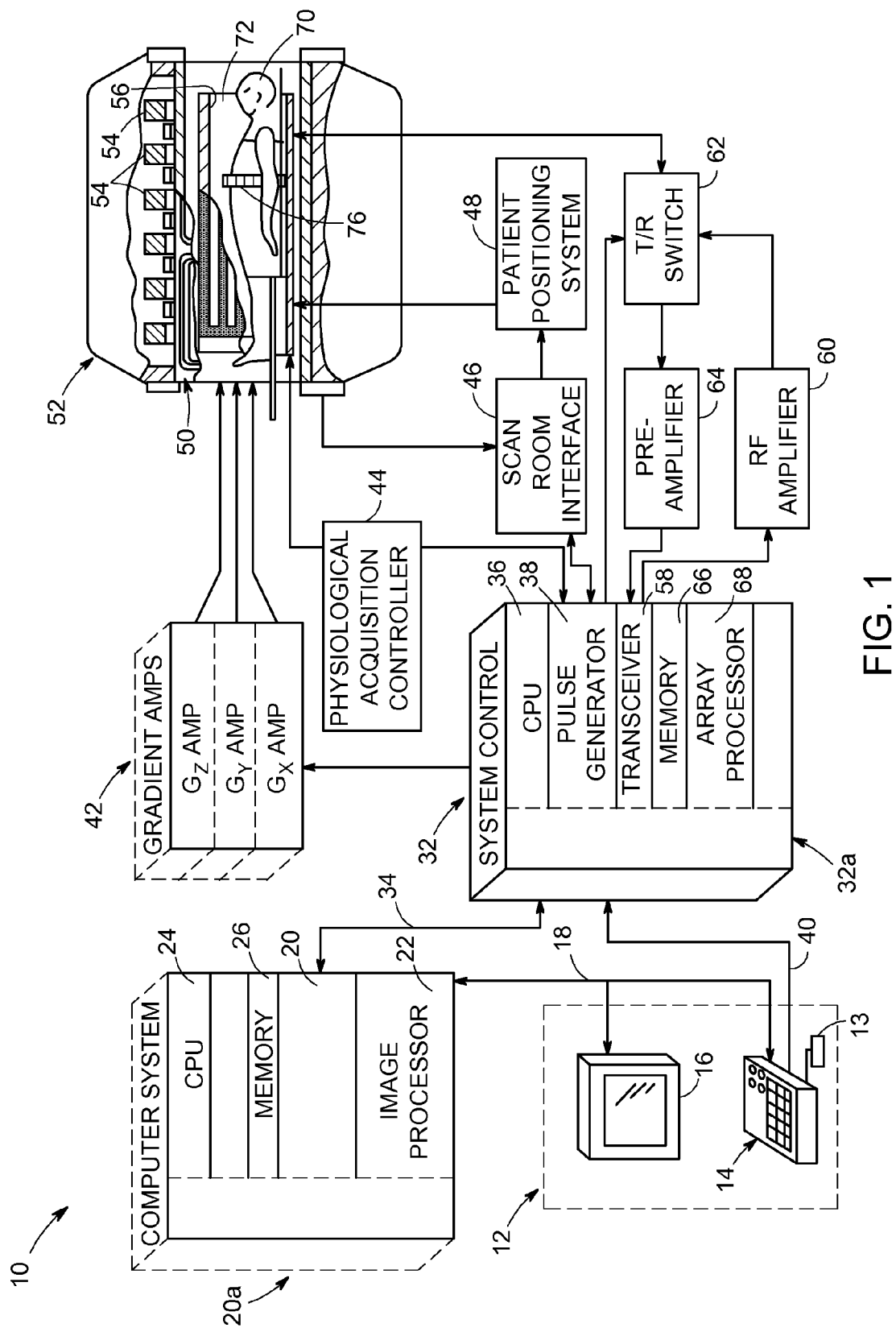
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$, and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a superconducting magnet with superconducting main coils 54. The superconducting magnet will be discussed in detail hereinafter. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
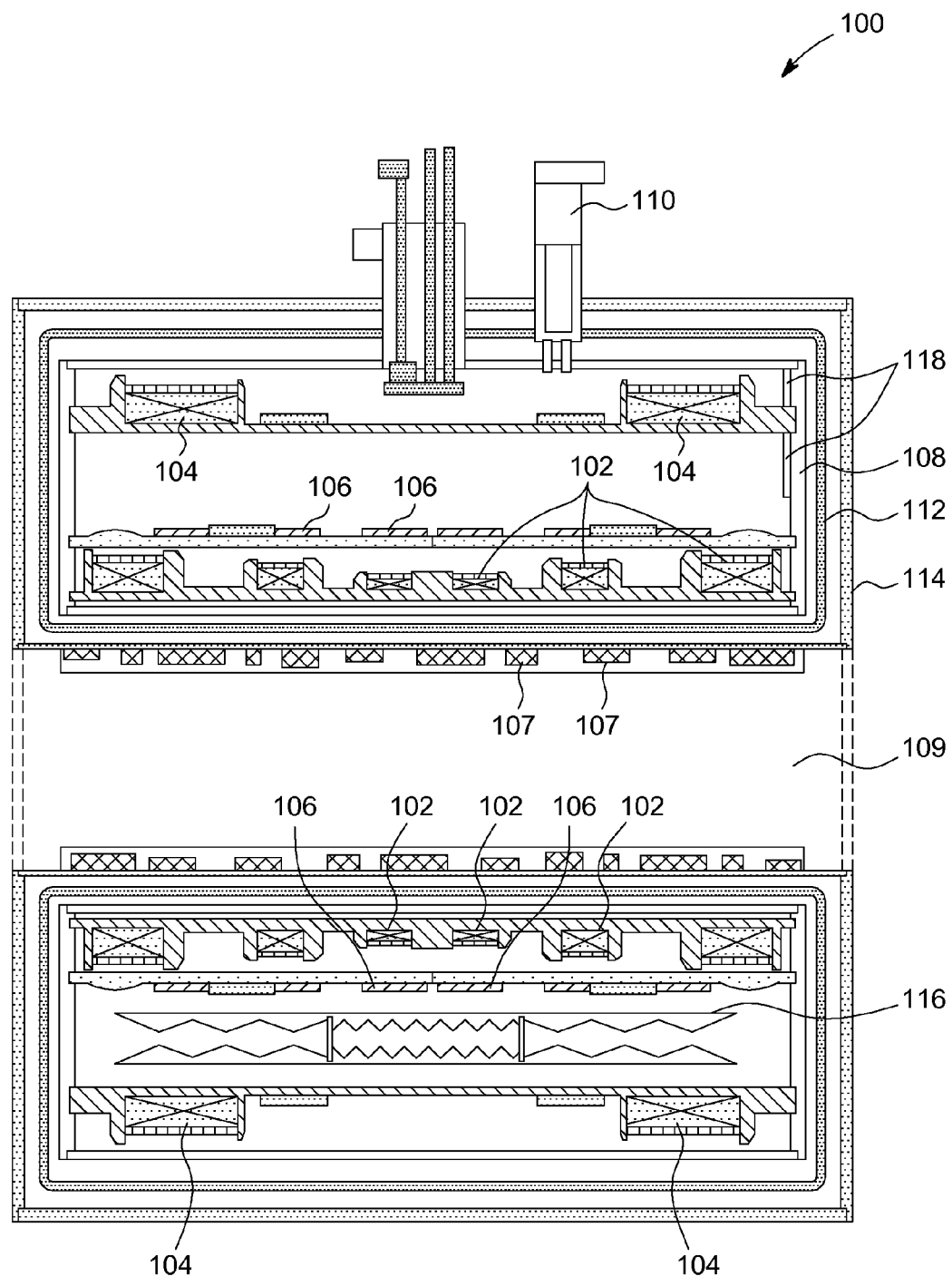
FIG. 2 is a schematic cross-sectional view of a cylindrical superconducting magnet in accordance with an embodiment.

FIG. 2 is a schematic cross-sectional view of a cylindrical superconducting magnet in accordance with an embodiment. It should be appreciated by those skilled in the art that the superconducting magnet may be in configurations other than cylindrical according to other embodiments. The superconducting magnet 100 is compatible with the above-described MRI system of FIG. 1 or any similar or equivalent system for obtaining MR images. The superconducting magnet 100 includes, among other elements, main coils 102, bucking coils 104, active shims 106, and passive shims 107. The main coils 102, bucking coils 104, active shims 106, and passive shims 107 all surround a patient bore 109 where a patient may be positioned during imaging. When energized with current, the main coils 102 serve to generate the main magnetic field of the MRI system 10 (shown in FIG. 1). The bucking coils 104 are energized with current in a direction that is opposite to the main coils 102. The bucking coils 104 minimize the effects of stray magnetic field on other electronics in the MRI system 10. A plurality of active shims 106 are positioned between the main coils 102 and the bucking coils 104. The plurality of active shims 106 may be used to make small adjustments to the field created by the main coils 102. The main coils 102, the bucking coils 104, and the active shims 106 are all contained within a cryostat 108 filled with a cryogen such as liquid helium. The cryostat 108 may comprise a stainless steel vessel according to an embodiment.

In order to achieve efficient operation of the superconducting magnet 100, it is necessary to keep the main coils 102 and the bucking coils 104 very cold, such as 10 kelvin or lower. The superconducting magnet 100 includes a coldhead 110 that includes a compressor. The coldhead 110 recompresses gaseous helium back into a liquid state in order to keep the liquid helium level constant during operation of the superconducting magnet 100. The superconducting magnet 100 includes both a thermal shield 112 and a vacuum vessel 114 surrounding the cryostat in order to help insulate the cryostat 108 from heat generated by the rest of the MRI system 10 (shown in FIG. 1).

As described hereinabove, the superconducting magnet 100 is typically filled with liquid helium prior to being shipped from the manufacturer's facility. However, since there is typically not a sufficient power supply available to the coldhead 110 during shipping, a significant portion of the liquid helium may boil-off during the transportation of the magnet. A displacer 116 is disposed within the cryostat 108. The displacer 116 may be positioned between the main coils 102 and the bucking coils 104. According to an embodiment, the displacer 116 may be positioned at the bottom of the magnet 100 as shown in FIG. 2 to ensure that the displacer 116 is covered with liquid helium even after the superconducting magnet 100 has lost a significant fraction of the liquid helium due to boil-off. Details of the displacer 116 will be discussed hereinafter. The superconducting magnet 100 may also include a level probe 118 to detect the level of the liquid helium within the cryostat 108 According to an embodiment, a processor (not shown) may be coupled to both the level probe 118 and to the displacer 116. The level probe may transmit information about the level of liquid helium within the cryostat 108 to the processor and the processor may control the displacer 116 to maintain a desired liquid helium level. The displacer 116 is depicted within the cryostat 108 of the superconducting magnet 100 in accordance with an embodiment schematically represented in FIG. 2. However, it should be appreciated by those skilled in the art that according to other embodiments a displacer similar to displacer 116 may also be adapted for use within different non-zero-boiloff superconducting magnets. For example, a displacer may be used in superconducting magnets to compensate for the gradual level-loss of a liquid cryogen that occurs during regular operation. According to other embodiments, a displacer may also be used in devices other than superconducting magnets. Examples of devices that may use a displacer include a RF cavity-based accelerator, a free electron laser, and any other apparatus or installation that is required to be maintained at a sustained low temperature. The use of a displacer may enable the prolonged operation of an apparatus or installation at a low temperature without the need to refill the liquid cryogen.

Figure 3:
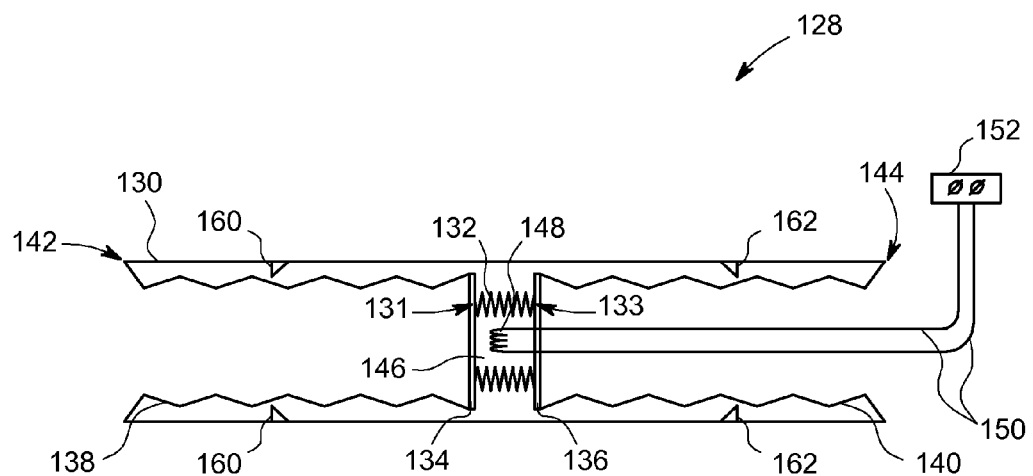
FIG. 3 is a schematic cross-sectional view of a displacer in accordance with an embodiment.

FIG. 3 is a schematic cross-sectional view of a displacer 128 in accordance with an embodiment. The displacer 128 is compatible with the above-described superconducting magnet 100 of FIG. 2 or any similar or equivalent superconducting magnets. The displacer 128 is shown in a collapsed state. The displacer 128 includes an outer housing 130 and an expandable member, such as an inner bellows 132. The inner bellows 132 has a first end 131 and a second end 133. The displacer 128 also includes a first outer bellows 138, and a second outer bellows 140.

Figure 4:
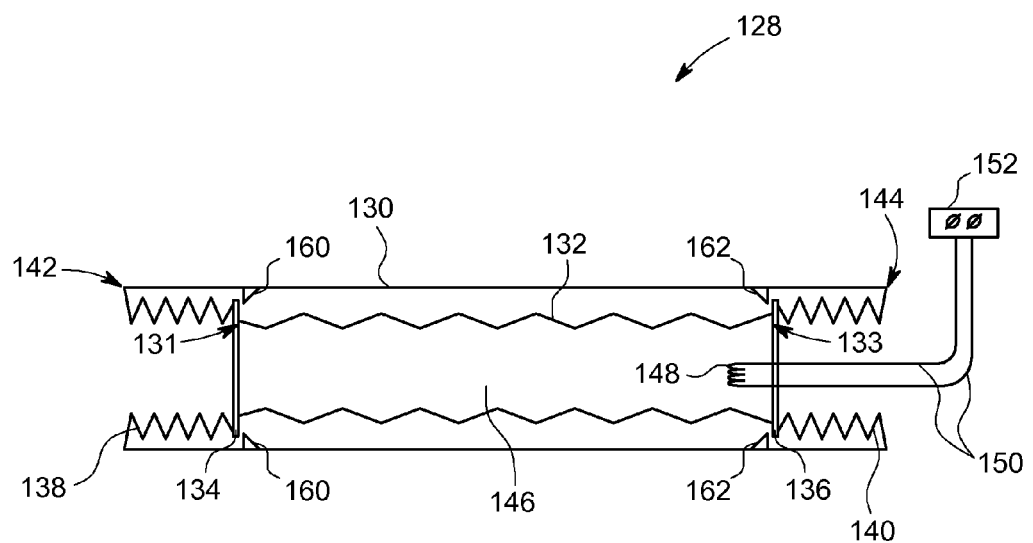
FIG. 4 is a schematic cross-sectional view of a displacer in accordance with an embodiment.

FIG. 4 is a schematic cross-sectional view of the displacer 128 from FIG. 3 in an expanded state. Common reference numbers will be used to indicate identical elements in both FIG. 3 and FIG. 4.

Referring now to both FIG. 3 and FIG. 4, the outer housing 130 is an open-ended cylindrical structure. According to an embodiment, the outer housing 130 may be comprised of a metal such as stainless steel. The first outer bellows 138 is attached to a first end 142 of the outer housing 130 and to a first end piece 134. For purposes of this disclosure, the term "bellows" is defined to include a flexible and expandable structure. For example, the bellows may comprise a generally tubular structure formed from metal with a series of pleats or folds. The pleats allow the bellows to expand or contract in an accordion-like manner. According to another embodiment, the bellows may comprise a flexible material. For example, the bellows may comprise a biaxially-oriented polyethylene terphthalate film with a metallized coating in accordance with an embodiment. The metallized coating may be comprised of a metal such as gold or aluminum. The metallized coating may also be comprised of an alloy according to other embodiments. The bellows may not have a series of pleats or folds in embodiments where the bellows comprise a flexible material. Additional details about the bellows will be disclosed hereinafter. Other embodiments may have an outer housing with a shape other than cylindrical. For example, the outer housing may be any shape as long as there is a suitable transition from the outer housing to the outer bellows. The second outer bellows 140 is attached to a second end 144 of the outer housing 130 and to a second end piece 136. Although the embodiment shown in FIGS. 3 and 4 depicts the first end piece 134 and the second end piece 136 as generally flat, other embodiments may include end pieces of different shapes. The first end piece 134, the second end piece 136, and the inner bellows 132 form a sealed chamber 146. The sealed chamber 146 is designed to be isolated from the liquid helium even when the displacer 128 is positioned in a cryostat filled with liquid helium.

The displacer 128 also includes an electric heater 148 attached to the second end piece 136. The electric heater 148 is positioned inside the sealed chamber 146. Control wires 150 run from the electric heater 148 to a switch assembly 152. According to an embodiment, the sealed chamber 146 is filled with a volume of a gas, such as helium. When the switch assembly 152 is in an "off" position, no current flows through the electric heater 148. Conversely, when the switch assembly 152 is in an "on" position, current flows through the electric heater 148. Other embodiments may have the heater attached to the first end piece 134 or to the inner bellows 132.

When the displacer 128 is in the collapsed state, as in FIG. 3, the volume of helium gas in the sealed chamber 146 is at a relatively low temperature and, hence, low pressure. However, once the switch assembly 152 is in the "on" position, current flows through the electric heater 148. The electric heater 148 comprises a resistive element that radiates heat with the application of current. The electric heater 148 warms the volume of helium gas in the sealed chamber 146, causing the pressure of the helium gas to increase. The increased pressure exerts a separating force on the first end piece 134 and the second end piece 136. The inner bellows 132 are designed to expand, thus allowing the sealed chamber 146 to occupy a larger volume. As the inner bellows 132 expands, the first outer bellows 138 and the second outer bellows 140 both contract. The sealed chamber 146 transitions from a smaller volume configuration to a larger volume configuration when the inner bellows 132 expands. The first end piece 134 moves towards the first end 142 of the outer housing and the second end piece 136 moves towards the second end 144 of the outer housing. According to an embodiment, the first end piece 134 moves until it passes a first set of stoppers 160, and the second end piece 136 moves until it passes a second set of stoppers 162. The first set of stoppers 160 and the second set of stoppers 162 may each comprise a plurality of spring members that are adapted to keep the end pieces (160, 162) from returning back towards their collapsed positions. Once the end pieces (134, 136) have been engaged by the stoppers (160, 162), it is not necessary to maintain current flow to the heater 148 in order to keep the inner bellows 132 in its expanded state. Embodiments may have multiple sets of stoppers at different distances from the first end 142 for the first end piece 134 and at different distances from the second end 144 for the second end piece 136 in order to fine tune the final position of the end pieces (134, 136).

The inner bellows 132, the first outer bellows 138, and the second outer bellows 140 may all share a similar structure according to an embodiment. For example, the cross-section taken perpendicularly to the direction of expansion may be generally circular. Other embodiments may use bellows with a different cross-sectional shape. Those skilled in the art will appreciate that it is necessary to account for the flexibility of the metal when determining the cross-sectional shapes that are feasible. For example, it may be easier to fabricate metal bellows with a generally oval cross-sectional shape as opposed to a cross-sectional shape with hard corners such as a rectangle.

Still referring to FIGS. 3 and 4, when the inner bellows 132 expands, the sealed chamber 146 transitions from a shape with a smaller volume to one with a larger volume. Once the sealed chamber 146 increases in volume, the first end piece 134 and the second end piece 136 cause the displacer 128 to have a larger overall volume as well. When the displacer 128 is positioned in a cryostat 108 (shown in FIG. 2) filled with a liquid cryogen, the level of the liquid cryogen may be controlled by changing the overall volume of the displacer 128. When the displacer 128 is in the expanded state, as shown in FIG. 4, the level of the liquid helium (shown in FIG. 2) in the superconducting magnet 100 (shown in FIG. 2) will rise. Thus, by employing one of more displacers 130, it is possible to maintain the proper level of liquid helium in a superconducting magnet without having to add liquid helium to the magnet at the installation site. According to an embodiment, the level probe 118 (shown in FIG. 2) may be used to detect the level of liquid helium in the cryostat 108 (shown in FIG. 2). Then a processor (not shown) may automatically control the one or more displacers 128 to maintain a desired liquid helium level. According to another embodiment, an operator may manually actuate the one or more displacers 128 in order to achieve an appropriate level of liquid helium.

Figure 5:
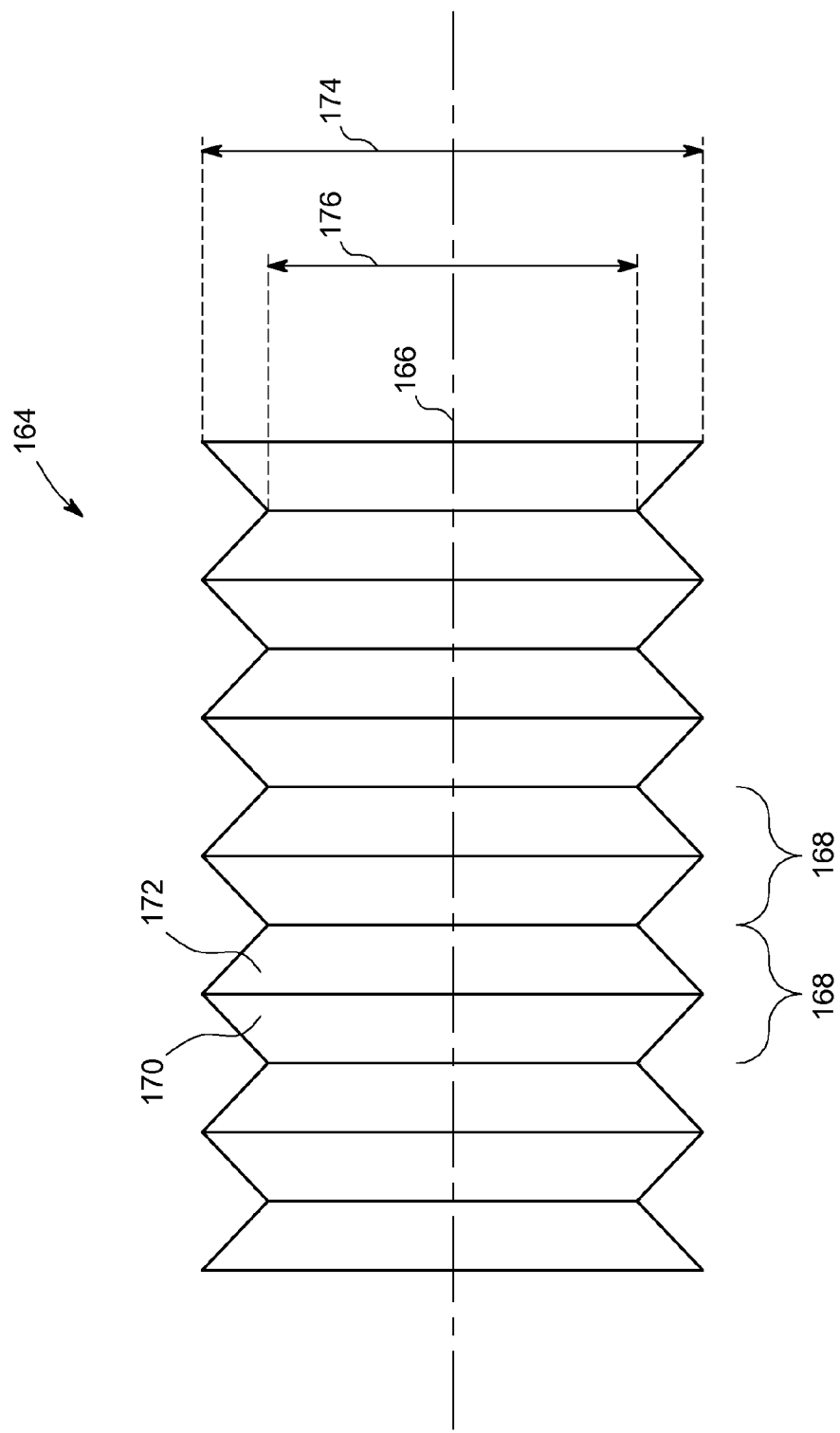
FIG. 5 is a schematic representation of an exterior view of a bellows in accordance with an embodiment.

FIG. 5 is a schematic representation of an exterior view of a bellows 164 in accordance with an embodiment. The bellows 164 is circular in cross-section as measured perpendicularly to a longitudinal axis 166. The bellows comprises a plurality of pleats 168. Each of the plurality of pleats 168 is comprised of a flexible material, such as stainless steel, that allows the bellows 164 to expand and contract along the longitudinal axis 166. According to an embodiment, the bellows 164 may comprise multiple pieces or segments of sheet metal that are welded or brazed together. For example, a first segment 170 may be welded to a second segment 172 in order to form one of the pleats. Other joining methods that maintain their strength and flexibility in the cold temperatures of a superconducting magnet may also be used to construct the bellows according to other embodiments. The bellows 164 has a maximum diameter 174 and a minimum diameter 176 dictated by the depth of the pleats 168.

Referring to both FIG. 4 and FIG. 5, the inner bellows 132, the first outer bellows 138, and the second outer bellows 140 may all be structurally similar to the bellows 164 shown in FIG. 5. However, according to an embodiment, the inner bellows 132 may have an outer diameter that is smaller than the outer diameter of the first outer bellows 138 and the second outer bellows 140. According to other embodiments, the inner bellows 132, the first outer bellows 138, and the second outer bellows 140 may all have similar inner diameters and outer diameters. According to another embodiment, a displacer may include a continuous bellows with constant inner and outer dimensions that is segmented into an inner bellows, a first outer bellows, and a second outer bellows by a first end piece and a second end piece. Other embodiments may only include the inner bellows and a first outer bellows. According to these embodiments, the displacer would only expand in a single direction.

Figure 6:
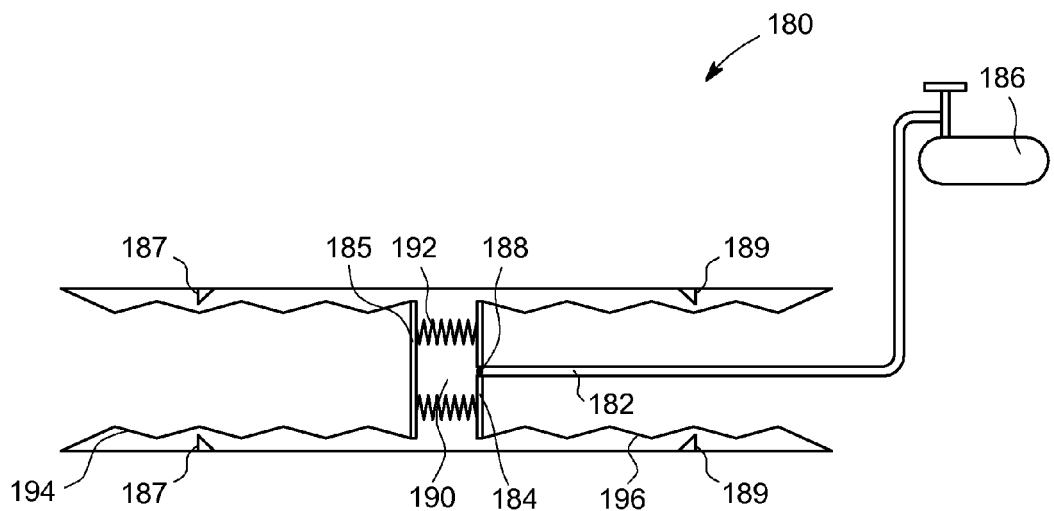
FIG. 6 is a schematic cross-sectional view of a displacer in accordance with an embodiment.

FIG. 6 is a schematic cross-sectional view of a displacer in accordance with an embodiment. The displacer 180 shares many components with the displacer 128 that was described in FIGS. 3 and 4. Features that are common between the displacer 128 (shown in FIG. 4) and the displacer 180 will not be described in detail.

The displacer 180 includes a pipe 182 attached to a second end piece 184. The pipe is connected to a source of pressurized gas, such as a helium tank 186. A valve 188 is positioned in the pipe 182 in order to control the movement of helium gas. According to other embodiments, the valve 188 may be positioned closer to the helium tank 186. When the valve 188 is open, helium from the helium tank fills a sealed chamber 190 of the displacer 180. As the pressure in the sealed chamber 190 increases, an inner bellows 192 expands while a first outer bellows 194 and a second outer bellows 196 contract. The pressure and volume of helium gas supplied by the helium tank 186 to the sealed chamber 190 determines the amount of expansion of the sealed chamber 190 and, therefore, the total volume displaced by the displacer 180. The inner bellows 192 may expand until a first end piece 185 passes a first set of stoppers 187 and the second end piece 184 passes a second set of stoppers 189. After the inner bellows 192 expands to the desired size and the first end piece 185 is engaged by the first set of stoppers 187 and the second end piece 184 is engaged by the second set of stoppers 189, the gas may be pumped out of the sealed chamber 190 according to an embodiment.

Figure 7:
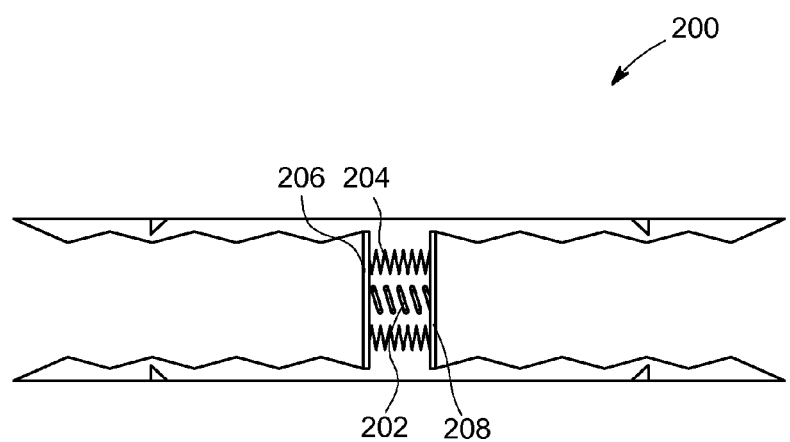
FIG. 7 is a schematic cross-sectional view of a displacer in accordance with an embodiment.

FIG. 7 is a schematic cross-sectional view of a displacer in accordance with an embodiment. The displacer 200 shares many components with the displacer 128 that was described in FIGS. 3 and 4. Features that are common between the displacer 128 (shown in FIGS. 3 and 4) will not be described in detail.

The displacer 200 includes a spring 202 disposed inside an inner bellows 204. The spring 202 is a coil spring, but other types of springs such as leaf springs may also be used. When the displacer is in its low volume configuration, the spring 202 is compressed and held in place by a switch (not shown). Activation of the switch causes the spring 202 to exert a force on a first end piece 206 and a second end piece 208, causing the inner bellows 204 to expand and the displacer 200 to transition into its higher volume configuration. According to other embodiments, the spring 202 may be replaced with a motor and a drive mechanism. The drive mechanism converts motion from the motor into translational motion that pushes on the end pieces and causes the inner bellows to expand.

This written description uses examples to disclose embodiments of the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A displacer for adjusting a level of a liquid cryogen in a cryostat comprising:
    an outer housing;
    an inner bellows disposed within the outer housing, said inner bellows configured to change from a collapsed state to an expanded state;
    a first end piece attached to a first end of the inner bellows, said first end piece configured to move with respect to the outer housing as the inner bellows changes from the collapsed state to the expanded state;
    a second end piece attached to a second end of the inner bellows; and
    an outer bellows attached to the outer housing and at least one of the first end piece and the inner bellows;
    wherein the first end piece, the second end piece, and the inner bellows define a sealed chamber.

2. The displacer of claim 1, wherein the outer housing is cylindrical in shape.

3. The displacer of claim 1, further comprising a spring disposed within the inner bellows, wherein the spring is adapted to exert a force acting to separate the first end piece from the second end piece.

4. The displacer of claim 1, further comprising a volume of helium gas disposed within the sealed chamber.

5. The displacer of claim 4, further comprising an electric heater disposed within the sealed chamber, the electric heater configured to adjust the temperature of the volume of helium gas within the sealed chamber.

6. The displacer of claim 4, further comprising a pipe attached to the first end piece, the pipe configured to deliver a pressurized gas to the sealed chamber.

7. The displacer of claim 4, further comprising a pipe attached to the second end piece, the pipe configured to deliver a pressurized gas to the sealed chamber.

8. The displacer of claim 1, further comprising a second outer bellows attached to the second end piece and the outer housing, said second outer bellows being configured to allow the second end piece to move with respect to the outer housing.

9. The displacer of claim 1, wherein the inner bellows comprises a flexible material.

10. The displacer of claim 1, wherein the cryostat is configured for use with a superconducting magnet.

11. A displacer for adjusting a level of a liquid cryogen within a cryostat comprising:
    an open-ended outer housing;
    an inner expandable member disposed within the open-ended outer housing and at least partially defining a sealed chamber, the inner expandable member configured to transition from a collapsed state where the sealed chamber has a smaller volume to an expanded state where the sealed chamber has a larger volume;
    a first end piece attached to a first end of the inner expandable member;
    a second end piece attached to a second end of the inner expandable member; and
    an outer expandable member attached to the outer housing and to the first end piece;
    wherein the first end piece is configured to move as the inner expandable member changes from the collapsed state to the expanded state, with the outer expandable member being constructed to provide for movement of the first end piece with respect to the outer housing as the inner expandable member changes from the collapsed state to the expanded state; and
    wherein the first end piece, the second end piece, and the inner expandable member define the sealed chamber.

12. The displacer of claim 11, wherein the inner and outer expandable members, the first end piece, and the second end piece are all adapted for use with a superconducting magnet.

13. The displacer of claim 11, wherein the each of the inner expandable member and the outer expandable member comprises multiple pieces of a sheet metal formed into at least one pleat.

14. The displacer of claim 13, wherein the multiple pieces of the sheet metal are welded or brazed together to form the at least one pleat.

15. The displacer of claim 13, wherein each of the inner expandable member and the outer the expandable member comprises a bellows made of metal.

16. The displacer of claim 13, wherein the sheet metal is selected from the group consisting of stainless steel, copper, and aluminum.

17. A displacer for adjusting a level of a liquid cryogen in a cryostat comprising:
    an open-ended outer housing;
    an inner expandable member disposed within the open-ended outer housing, said inner expandable member configured to change from a collapsed state to an expanded state;
    a first end piece attached to a first end of the inner expandable member and disposed within the open-ended outer housing, said first end piece configured to move with respect to the open-ended outer housing as the inner expandable member changes from the collapsed state to the expanded state;
    a second end piece attached to a second end of the inner expandable member and disposed within the open-ended outer housing;
    a first outer expandable member attached to the open-ended outer housing and at least one of the first end piece and the inner expandable member; and
    a second outer expandable member attached to the open-ended outer housing and at least one of the second end piece and the inner expandable member.

18. The displacer of claim 17, wherein the second end piece is configured to move with respect to the open-ended outer housing as the inner expandable member changes from the collapsed state to the expanded state.

19. A displacer for adjusting a level of a liquid cryogen in a cryostat comprising:
    an outer housing;
    an inner bellows disposed within the outer housing, said inner bellows configured to change from a collapsed state to an expanded state;
    a first end piece attached to a first end of the inner bellows, said first end piece configured to move with respect to the outer housing as the inner bellows changes from the collapsed state to the expanded state;
    a second end piece attached to a second end of the inner bellows; and
    a first outer bellows attached to the outer housing and at least one of the first end piece and the inner bellows; and
    a second outer bellows attached to the second end piece and the outer housing, said second outer bellows being configured to allow the second end piece to move with respect to the outer housing.

* * * * *